(12) United States Patent
Chen et al.

(10) Patent No.: US 8,743,627 B2
(45) Date of Patent: Jun. 3, 2014

(54) MEMORY DEVICE AND VOLTAGE INTERPRETING METHOD FOR READ BIT LINE

(75) Inventors: Shi-Wen Chen, Kaohsiung (TW); Tsan-Tang Chen, Miaoli County (TW); Chi-Chang Shuai, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 375 days.

(21) Appl. No.: 13/352,411

(22) Filed: Jan. 18, 2012

(65) Prior Publication Data

US 2013/0182519 A1 Jul. 18, 2013

(51) Int. Cl.
*G11C 7/12* (2006.01)

(52) U.S. Cl.
USPC ............... 365/189.09; 365/154; 365/189.18; 365/203; 365/210.1

(58) Field of Classification Search
CPC ............. G11C 7/12; G11C 7/14; G11C 16/28
USPC ............. 365/154, 189.15, 189.09, 203, 210.1
See application file for complete search history.

(56) References Cited

U.S. PATENT DOCUMENTS

| 5,325,337 | A * | 6/1994 | Buttar | 365/203 |
|---|---|---|---|---|
| 6,188,599 | B1 * | 2/2001 | Kang | 365/65 |
| 6,724,648 | B2 * | 4/2004 | Khellah et al. | 365/154 |
| 7,502,275 | B2 * | 3/2009 | Nii et al. | 365/226 |
| 2002/0186579 | A1 * | 12/2002 | Yokozeki | 365/154 |
| 2003/0210566 | A1 * | 11/2003 | Yamagami | 365/154 |
| 2004/0114424 | A1 * | 6/2004 | Yoshida | 365/154 |
| 2007/0008771 | A1 * | 1/2007 | Lee et al. | 365/154 |
| 2009/0207675 | A1 * | 8/2009 | Kengeri et al. | 365/189.14 |

OTHER PUBLICATIONS

Naveen Verma et al, "A 256 kb 65 nm 8T Subthreshold SRAM Employing Sense-Amplifier Redundancy", Jan. 2008, vol. 43, pp. 141-149, IEEE Journal of Solid-State Circuits.

* cited by examiner

*Primary Examiner* — Douglas King
(74) *Attorney, Agent, or Firm* — WPAT, PC; Justin King

(57) ABSTRACT

A memory device comprises a memory cell array, a first and a second pre-charging switch circuits, a selecting circuit, an auxiliary memory cell array, a dynamic voltage controller and a sense amplifier. The auxiliary memory cell array comprises an auxiliary read bit line and a plurality of memory cells arranged in a column and electrically connected to the auxiliary read bit line. The second pre-charging switch circuit determines whether or not to supply a reference voltage to each of the aforementioned memory cells according to a pre-charging control signal. The dynamic voltage controller determines whether or not to supply a voltage to the auxiliary read bit line according to the voltage level of the output signal of the selecting circuit. The sense amplifier compares the voltage levels of the output signal of the selecting circuit and the voltage on the auxiliary read bit line to output a sensing result accordingly.

10 Claims, 4 Drawing Sheets

```
┌─────────────────────────────┐
│  providing a auxiliary memory cell
│ array, wherein the auxiliary memory
│   cell array comprises a auxiliary
│    read bit line and a plurality of
│   second memory cells, the second      ~ S302
│    memory cells are arranged in a
│    matrix, and each of the second
│       memory cells is electrically
│ connected to the auxiliary read bit
│   line and one of the read word lines
└─────────────────────────────┘
              ↓
┌─────────────────────────────┐
│    providing a second pre-charging
│   switch circuit, wherein the second
│      pre-charging switch circuit is
│    electrically connected to each of
│   the second memory cells, the second
│  pre-charging switch circuit is used   ~ S304
│    for receiving a reference voltage
│   and for determining whether or not
│    to supply the reference voltage to
│   each of the second memory cells as
│    an operating voltage according to
│      the pre-charging control signal
└─────────────────────────────┘
              ↓
           ( S306 )
```

FIG. 3A

MEMORY DEVICE AND VOLTAGE INTERPRETING METHOD FOR READ BIT LINE

FIELD OF THE INVENTION

The present invention relates to a memory technology field, and more particularly to a memory device and a voltage interpreting method for read bit line.

BACKGROUND OF THE INVENTION

Generally, a memory device comprises a memory cell array, a selecting circuit and a sense amplifier. The selecting circuit is electrically connected to the read bit lines arranged in the memory cell array, and the selecting circuit is configured for selecting one of the read bit lines and referring the signal on the selected read bit line as an output signal. The sense amplifier is configured for comparing the voltage level of the output signal of the selecting circuit with a reference voltage having a constant voltage level and outputting a sensing result accordingly. Therefore, an electronic apparatus adopting the memory device can interpret the content stored in a selected memory cell to be either logic "1" or logic "0" according to the sensing result.

However, an electrical leakage always occurs on each of the read bit lines so the voltages on the read bit lines do not completely correspond to the content stored in the selected memory cell. In other words, the sense amplifier will compare an inaccurate voltage level with the voltage level of the reference voltage, causing an incorrect sensing result. As a result, the electronic apparatus adopting the memory device will not correctly interpret the content of the selected memory cell according to the sensing result outputted from the sense amplifier.

SUMMARY OF THE INVENTION

The present invention provides a memory device to prevent the problem of data misreading.

The present invention also provides a voltage interpreting method for read bit line.

The present invention provides a memory device, which comprises a memory cell array, a first pre-charging switch circuit, a selecting circuit, an auxiliary memory cell array, a second pre-charging switch circuit, a dynamic voltage controller and a sense amplifier. The memory cell array comprises a plurality of read word lines, a plurality of read bit lines and a plurality of first memory cells. The first memory cells are arranged in a matrix, and each of the first memory cells is electrically connected to one of the read bit lines and one of the read word lines. The first pre-charging switch circuit is electrically connected to each of the first memory cells and is configured for receiving a first voltage and for determining whether or not to supply the first voltage to each of the first memory cells as an operating voltage according to a pre-charging control signal. The selecting circuit is electrically connected to each of the read bit lines and is configured for selecting one of the read bit lines and referring the signal on the selected read bit line as an output signal. The auxiliary memory cell array comprises an auxiliary read bit line and a plurality of second memory cells. The second memory cells are arranged in a matrix, and each of the second memory cells is electrically connected to the auxiliary read bit line and one of the read word lines. The second pre-charging switch circuit is electrically connected to each of the second memory cells and is configured for receiving a reference voltage and for determining whether or not to supply the reference voltage to each of the second memory cells as an operating voltage according to the pre-charging control signal. The dynamic voltage controller is electrically connected to the output of the selecting circuit and the auxiliary read bit line, and the dynamic voltage controller is configured for receiving a second voltage and determine whether or not to supply the second voltage to the auxiliary read bit line according to the voltage level of the output signal of the selecting circuit. The sense amplifier is electrically connected to the output of the selecting circuit and the auxiliary read bit line and is configured for comparing the voltage level of the output signal of the selecting circuit with the voltage level of the voltage on the auxiliary read bit line and outputting a sensing result accordingly.

The present invention provides a voltage interpreting method for read bit line, and the voltage interpreting method is applied to a memory device. The memory device comprises a memory cell array, a first pre-charging switch circuit, a selecting circuit and a sense amplifier. The memory cell array comprises a plurality of read word lines, a plurality of read bit lines and a plurality of first memory cells. The first memory cells are arranged in a matrix, and each of the first memory cells is electrically connected to one of the read bit lines and one of the read word lines. The first pre-charging switch circuit is electrically connected to each of the first memory cells and is configured for receiving a first voltage and for determining whether or not to supply the first voltage to each of the first memory cells as an operating voltage according to a pre-charging control signal. The selecting circuit is electrically connected to each of the read bit lines and is configured for selecting one of the read bit lines and referring the signal on the selected read bit line as an output signal. The sense amplifier is electrically connected to the output of the selecting circuit. The voltage interpreting method comprises the following steps: providing an auxiliary memory cell array, wherein the auxiliary memory cell array comprises an auxiliary read bit line and a plurality of second memory cells, the second memory cells are arranged in a matrix, and each of the second memory cells is electrically connected to the auxiliary read bit line and one of the read word lines; providing a second pre-charging switch circuit, wherein the second pre-charging switch circuit is electrically connected to each of the second memory cells, the second pre-charging switch circuit is used for receiving a reference voltage and for determining whether or not to supply the reference voltage to each of the second memory cells as an operating voltage according to the pre-charging control signal; determining whether or not to supply the second voltage to the auxiliary read bit line according to the voltage level of the output signal of the selecting circuit, so as to dynamically adjust the voltage level of the voltage on the auxiliary read bit line; and supplying the voltage on the auxiliary read bit line to the sensing amplifier, wherein the sensing amplifier compares the voltage level of the output signal of the selecting circuit with the voltage level of the voltage on the auxiliary read bit line, so as to output a sensing result accordingly.

In summary, the problems occurring in the conventional memory device can be prevented by disposing an auxiliary memory cell array, a second pre-charging switch circuit and a dynamic voltage controller in the memory device. The dynamic voltage controller is configured for determining whether or not to supply a voltage to the auxiliary read bit line arranged in the auxiliary memory cell array according the voltage level of the output signal of the selecting circuit. The sense amplifier is configured for comparing the voltage level of the output signal of the selecting circuit with the voltage level of the voltage on the auxiliary read bit line and outputting a sensing result accordingly.

When a memory cell storing a content of logic "1" is selected, the selecting circuit will select the signal on a corresponding read bit line as an output signal. Since an electrical leakage occurs on the corresponding read bit line, the voltage level of the output signal of the selecting circuit is reduced. However, the electrical leakage also occurs on the auxiliary read bit line, the voltage level of the signal on the auxiliary read bit line is also reduced, and the voltage drop on the signal on the auxiliary read bit line is similar to the voltage drop on the output signal of the selecting circuit. Therefore, the sense amplifier still can correctly determine that the voltage level of the output signal of the selecting circuit is larger than that of the voltage on the auxiliary read bit line. Thus, the sense amplifier can accordingly output a sensing result for indicating that the content stored in the selected memory cell of the memory cell array is logic "1".

Alternatively, when a memory cell storing a content of logic "0" is selected, since the output signal of the selecting circuit is at a low voltage level and it will enable the dynamic voltage controller to pull up the voltage level of the signal on the auxiliary read bit line to the voltage level of the second voltage, the sense amplifier still can correctly determine that the voltage level of the output signal of the selecting circuit is smaller than that of the voltage on the auxiliary read bit line. Thus, the sense amplifier can accordingly output a sensing result for indicating that the content stored in the selected memory cell of the memory cell array is logic "0". In other words, even each of the read bit lines has an electrical leakage, the memory device of the present invention still can successfully determine the content stored in the selected memory cell no matter the content stored in the selected memory cell is logic "1" or logic "0".

BRIEF DESCRIPTION OF THE DRAWINGS

The present invention will become more readily apparent to those ordinarily skilled in the art after reviewing the following detailed description and accompanying drawings, in which:

FIGS. 3A and 3B show a flow chart of a voltage interpreting method for read bit line in accordance with an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
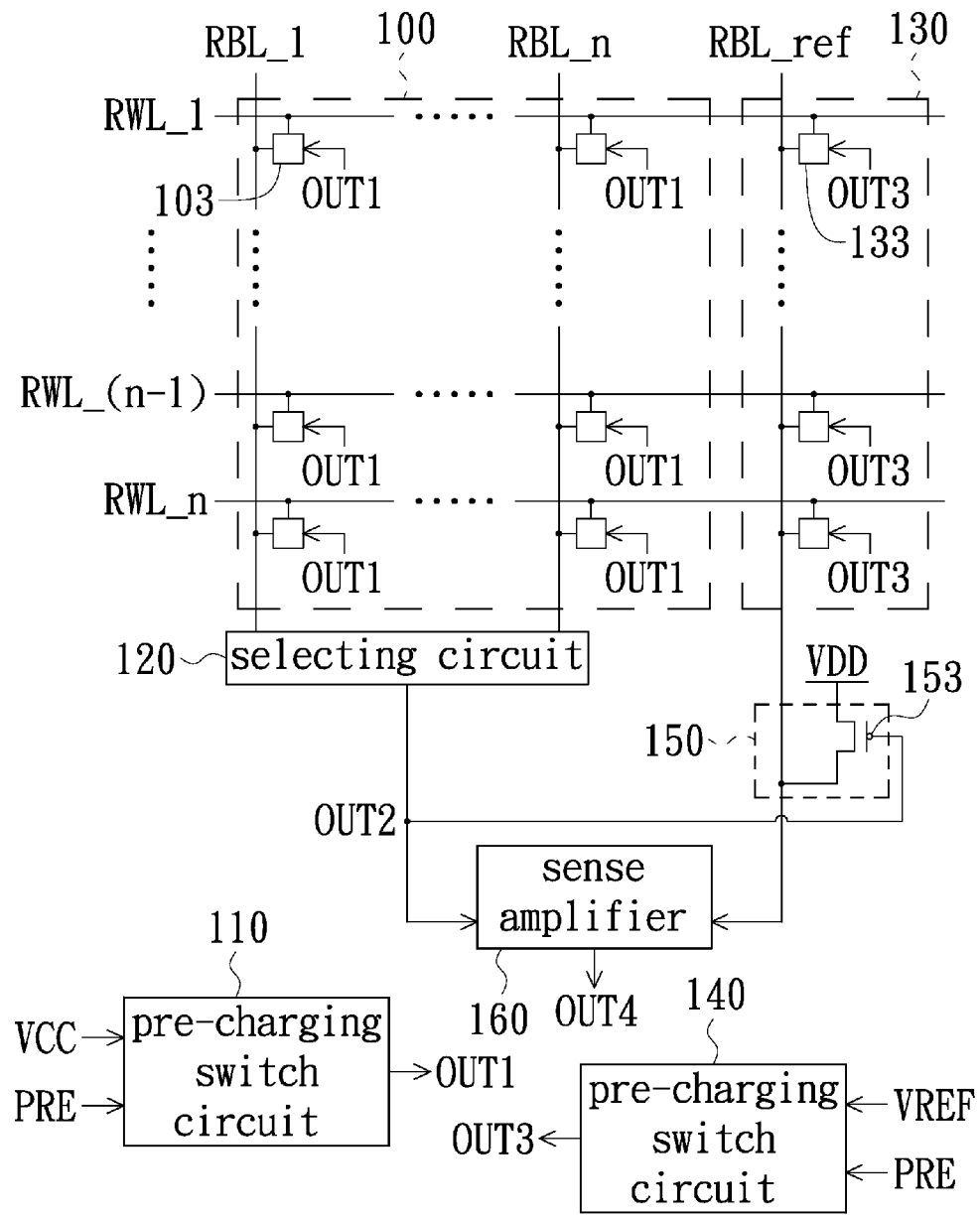
FIG. 1 is a schematic view of a memory device in accordance with an embodiment of the present invention.

FIG. 1 is a schematic view of a memory device in accordance with an embodiment of the present invention. Referring to FIG. 1, the memory device 10 comprises a memory cell array 100, pre-charging switch circuits 110, 140, a selecting circuit 120, an auxiliary memory cell array 130, a dynamic voltage controller 150 and a sense amplifier 160.

Figure 2:
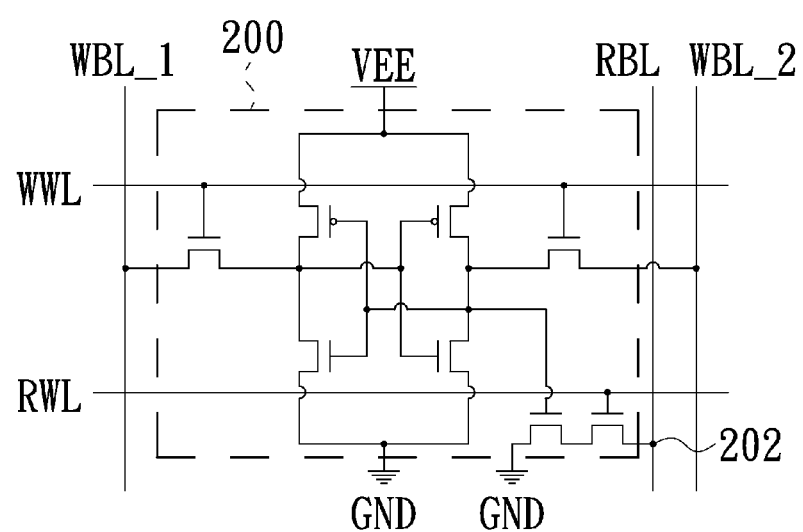
FIG. 2 is a schematic circuit view of a memory cell.

The memory cell array 100 comprises a plurality of read word lines (labeled by RWL_1-RWL_n), a plurality of read bit lines (labeled by RBL_1-RBL_n) and a plurality of memory cells (as shown by label 103). In this embodiment, each of the memory cells 103 has only one data read port. Referring to FIG. 2, which is a schematic circuit view of a memory cell. In FIG. 2, the label 200 denotes the memory cell 200, the label VEE denotes an operating voltage, the label GND denotes a ground voltage, the labels WBL_1, WBL_2 denote write bit lines, the label RBL denote a read bit line, the label WWL denotes a write word line, and the label RWL denotes a read word line. Specifically, the memory cell 200 has only one data read port 202, and the data read port 202 is electrically connected to the read bit line RBL.

Referring to FIG. 1, the memory cells 103 are arranged in a matrix. Each of the memory cells 103 is electrically connected to one of the read bit lines RBL_1-RBL_n through a data read port thereof (not shown), and each of the memory cells 103 is also electrically connected to one of the read word lines RWL_1-RWL_n. The pre-charging switch circuit 110 is electrically connected to the memory cells 103 in the memory cell array 100, and the pre-charging switch circuit 110 is configured for receiving a voltage VCC and for determining whether or not to refer the voltage VCC as an output signal OUT1 according to a pre-charging control signal PRE. Wherein, the output signal OUT1 is supplied to each of the memory cells 103 as an operating voltage. The selecting circuit 120 is electrically connected to the read bit lines RBL_1-RBL_n, and the selecting circuit 120 is configured for selecting one of the read bit lines RBL_1-RBL_n and referring the signal on the selected read bit line as an output signal OUT2.

The auxiliary memory cell array 130 comprises an auxiliary read bit line RBL_ref and a plurality of memory cells (as shown by label 133). In this embodiment, the memory cells 133 and the memory cell 103 have the same circuit structure. That is, each of the memory cells 133 has only one data read port. The memory cells 133 are arranged in a column. Each of the memory cells 133 is electrically connected to the auxiliary read bit line RBL_ref through its data read port (not shown), and each of the memory cells 133 is electrically connected to one of the read word lines RWL_1-RWL_n. The pre-charging switch circuit 140 is electrically connected to each of the memory cells 133 in the auxiliary memory cell array 130. The pre-charging switch circuit 140 is configured for receiving a reference voltage VREF and for determining whether or not to refer the reference voltage VREF as an output signal OUT3 according to the pre-charging control signal PRE. Wherein, the output signal OUT3 is supplied to each of the memory cells 133 as an operating voltage.

The dynamic voltage controller 150 is electrically connected to the auxiliary read bit line RBL_ref and the output of the selecting circuit 120. The dynamic voltage controller 150 is configured for receiving a voltage VDD and for determining whether or not to supply the voltage VDD to the auxiliary read bit line RBL_ref according to the output signal OUT2 of the selecting circuit 120. In this embodiment, the dynamic voltage controller 150 comprises a P-type transistor 153. The P-type transistor 153 can be implemented by a P-type Metal Oxide Semiconductor (PMOS). A source/drain of the P-type transistor 153 is electrically connected to the voltage VDD, the other source/drain of the P-type transistor 153 is electrically connected to the auxiliary read bit line RBL_ref, and the gate of the P-type transistor 153 is electrically connected to the output of the selecting circuit 120. Moreover, in this embodiment, the voltage VCC and the voltage VDD are larger than the reference voltage VREF, and the voltage VCC and the voltage VDD may have the same voltage level.

The sense amplifier 160 is electrically connected to the auxiliary read bit line RBL_ref and the output of the selecting circuit 120. The sense amplifier 160 is configured for comparing the voltage level of the output signal OUT2 of the selecting circuit 120 with the voltage level of the voltage on the auxiliary read bit line RBL_ref and outputting a sensing result OUT4 accordingly. When the sense amplifier 160 determines that the voltage level of the output signal of the selecting circuit 120 is larger than that of the voltage on the auxiliary read bit line RBL_ref, the sensing result OUT4 outputted by the sense amplifier 160 indicates that the content stored in the selected memory cell 103 is logic "1". Alternatively, when the sense amplifier 160 determines that the voltage level of the output signal of the selecting circuit 120 is smaller than that of the voltage on the auxiliary read bit line RBL_ref, the sensing result OUT4 outputted by the sense amplifier 160 indicates that the content stored in the selected memory cell 103 is logic "0".

Assuming that the memory cell 103 electrically connected to the read word line RWL_1 and the read bit line RBL_1 is selected and the content stored in this memory cell 103 is logic "1", the selecting circuit 120 selects the read bit line RBL_1 and refers the signal thereon as the output signal OUT2. Since an electrical leakage occurs on the read bit line RBL_1, the voltage level of the output signal OUT2 of the selecting circuit 120 is reduced. For example, the voltage level on the read bit line RBL_1 may drop from a predetermined 0.9V to 0.8V. Thus, the voltage level of the output signal OUT2 of the selecting circuit 120 will also be 0.8V. However, the electrical leakage also occurs on the auxiliary read bit line RBL_ref, the voltage level of the signal on the auxiliary read bit line RBL_ref is also reduced, and the voltage drop on the signal on the auxiliary read bit line RBL_ref is similar to the voltage drop on the output signal OUT2. For example, the voltage level on the auxiliary read bit line RBL_ref may drop from a predetermined 0.8V to 0.71V. Therefore, the sense amplifier 160 still can correctly determine that the voltage level of the output signal OUT2 is larger than that of the voltage on the auxiliary read bit line RBL_ref. Thus, the sense amplifier 160 can accordingly output a sensing result OUT4 for indicating that the content stored in the selected memory cell 103 of the memory cell array 100 is logic "1".

Alternatively, if the content stored in the selected memory cell 103 is logic "0", since the output signal OUT2 is at a low voltage level and it will turn on the P-type transistor 153 to pull up the voltage level of the signal on the auxiliary read bit line RBL_ref to the voltage level of the voltage VDD, the sense amplifier 160 still can correctly determine that the voltage level of the output signal OUT2 is smaller than that of the voltage on the auxiliary read bit line RBL_ref. Thus, the sense amplifier 160 can accordingly output a sensing result OUT4 for indicating that the content stored in the selected memory cell 103 of the memory cell array 100 is logic "0". In other words, even each of the read bit lines has an electrical leakage, the memory device 10 of the present invention still can successfully determine the content stored in the selected memory cell 103 no matter the content stored in the selected memory cell 103 is logic "1" or logic "0".

Figure 3B:
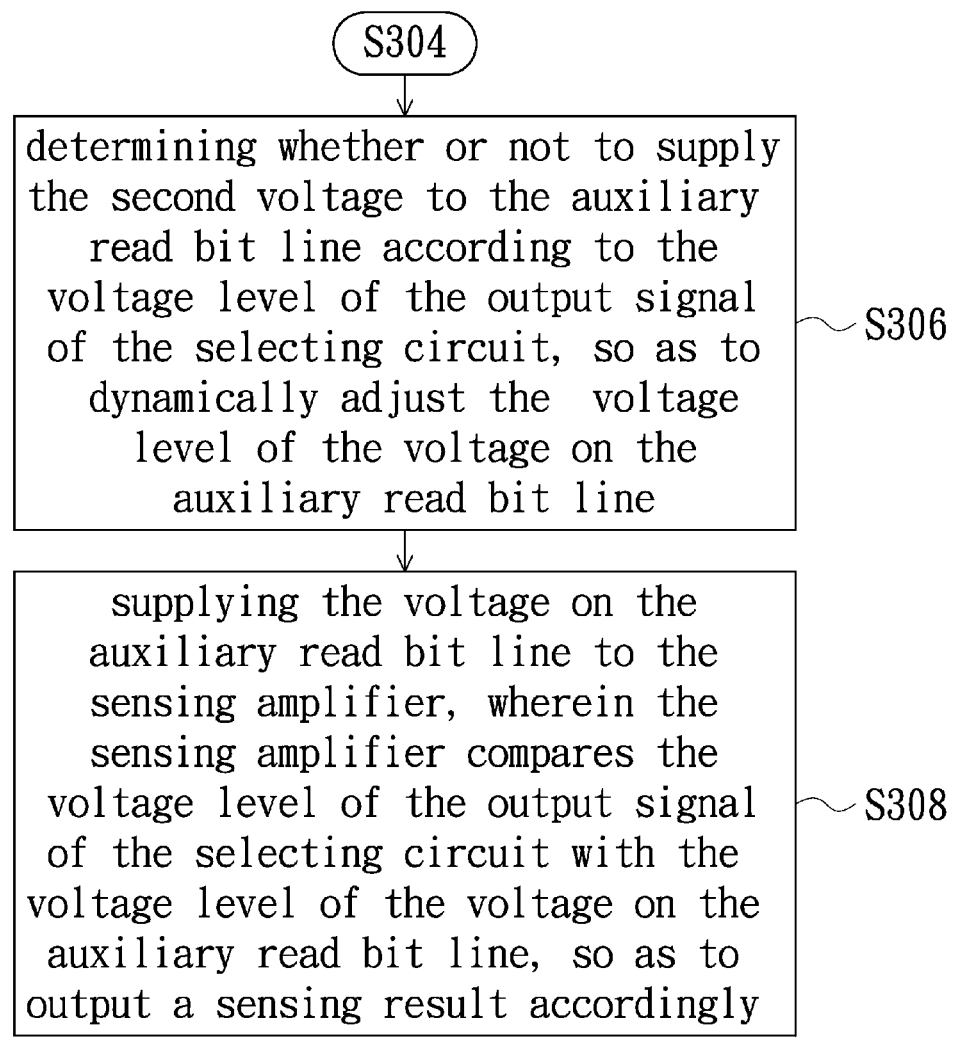

Based on the above description, a voltage interpreting method for read bit line is disclosed herein and can be summarized as depicted in FIGS. 3A and 3B. FIGS. 3A and 3B show a flow chart of a voltage interpreting method for read bit line in accordance with an embodiment of the present invention. The voltage interpreting method of the present embodiment is applied to a memory device. The memory device comprises a memory cell array, a first pre-charging switch circuit, a selecting circuit and a sense amplifier. The memory cell array comprises a plurality of read word lines, a plurality of read bit lines and a plurality of first memory cells. The first memory cells are arranged in a matrix, and each of the first memory cells is electrically connected to one of the read bit lines and one of the read word lines. The first pre-charging switch circuit is electrically connected to each of the first memory cells and is configured for receiving a first voltage and for determining whether or not to supply the first voltage to each of the first memory cells as an operating voltage according to a pre-charging control signal. The selecting circuit is electrically connected to each of the read bit lines and is configured for selecting one of the read bit lines and referring the signal on the selected read bit line as an output signal. The sense amplifier is electrically connected to the output of the selecting circuit. As shown in FIGS. 3A and 3B, firstly an auxiliary memory cell array is provided, wherein the auxiliary memory cell array comprises an auxiliary read bit line and a plurality of second memory cells, the second memory cells are arranged in a column, and each of the second memory cells is electrically connected to the auxiliary read bit line and one of the read word lines (as shown by step S302). Then, a second pre-charging switch circuit is provided, wherein the second pre-charging switch circuit is electrically connected to each of the second memory cells, and the second pre-charging switch circuit is configured for receiving a reference voltage and for determining whether or not to supply the reference voltage to each of the second memory cells as an operating voltage according to the pre-charging control signal (as shown by step S304). Next, whether or not to supply the second voltage to the auxiliary read bit line is determined according to the output signal of the selecting circuit, so as to dynamically adjust the voltage level on the auxiliary read bit line (as shown by step S306). Afterwards, a voltage on the auxiliary read bit line is supplied to the sensing amplifier, wherein the sensing amplifier compares the voltage level of the output signal of the selecting circuit with the voltage level of the voltage on the auxiliary read bit line and outputs a sensing result accordingly (as shown by step S308).

In summary, the problems occurring in the conventional memory device can be prevented by disposing an auxiliary memory cell array, a second pre-charging switch circuit and a dynamic voltage controller in the memory device. The dynamic voltage controller is configured for determining whether or not to supply a voltage to the auxiliary read bit line arranged in the auxiliary memory cell array according an output signal of the selecting circuit,. The sense amplifier is configured for comparing the voltage level of the output signal of the selecting circuit with the voltage level of the voltage on the auxiliary read bit line and outputting a sensing result accordingly.

When a memory cell storing a content of logic "1" is selected, the selecting circuit will select the signal on a corresponding read bit line as an output signal. Since an electrical leakage occurs on the corresponding read bit line, the voltage level of the output signal of the selecting circuit is reduced. However, the electrical leakage also occurs on the auxiliary read bit line, the voltage level of the signal on the auxiliary read bit line is also reduced, and the voltage drop on the signal on the auxiliary read bit line is similar to the voltage drop on the output signal of the selecting circuit. Therefore, the sense amplifier still can correctly determine that the voltage level of the output signal of the selecting circuit is larger than that of the voltage on the auxiliary read bit line. Thus, the sense amplifier can accordingly output a sensing result for indicating that the content stored in the selected memory cell of the memory cell array is logic "1".

Alternatively, when a memory cell storing a content of logic "0" is selected, since the output signal of the selecting circuit is at a low voltage level and it will enable the dynamic voltage controller to pull up the voltage level of the signal on the auxiliary read bit line to the voltage level of the second voltage, the sense amplifier still can correctly determine that the voltage level of the output signal of the selecting circuit is smaller than that of the voltage on the auxiliary read bit line. Thus, the sense amplifier can accordingly output a sensing result for indicating that the content stored in the selected memory cell of the memory cell array is logic "0". In other words, even each of the read bit lines has an electrical leakage, the memory device of the present invention still can successfully determine the content stored in the selected memory cell, no matter the content stored in the selected memory cell is logic "1" or logic "0".

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory device, comprising:
   a memory cell array, comprising:
     a plurality of read word lines;
     a plurality of read bit lines; and
     a plurality of first memory cells, the first memory cells being arranged in a matrix, and each of the first memory cells being electrically connected to one of the read bit lines and one of the read word lines;
   a first pre-charging switch circuit electrically connected to each of the first memory cells, the first pre-charging switch circuit being used for receiving a first voltage and for determining whether or not to supply the first voltage to each of the first memory cells as an operating voltage according to a pre-charging control signal;
   a selecting circuit electrically connected to each of the read bit lines, the selecting circuit being used for selecting one of the read bit lines and referring the signal on the selected read bit line as an output signal;
   an auxiliary memory cell array, comprising:
     an auxiliary read bit line; and
     a plurality of second memory cells, the second memory cells being arranged in a column, and each of the second memory cells being electrically connected to the auxiliary read bit line and one of the read word lines;
   a second pre-charging switch circuit electrically connected to each of the second memory cells, the second pre-charging switch circuit being for receiving a reference voltage and for determining whether or not to supply the reference voltage to each of the second memory cells as an operating voltage according to the pre-charging control signal;
   a dynamic voltage controller electrically connected to the output of the selecting circuit and the auxiliary read bit line, the dynamic voltage controller being used for receiving a second voltage and for determining whether or not to supply the second voltage to the auxiliary read bit line according to the voltage level of the output signal of the selecting circuit; and
   a sense amplifier electrically connected to the output of the selecting circuit and the auxiliary read bit line, the sense amplifier being used for comparing the voltage level of the output signal of the selecting circuit with the voltage level of the voltage on the auxiliary read bit line and outputting a sensing result accordingly.

2. The memory device according to claim 1, wherein the first memory cells and the second memory cells have the same circuit structure, each of the first memory cells and the second memory cells has only one data read port, the data read port of each of the first memory cells is electrically connected to one of the read bit lines, and the data read port of each of the second memory cells is electrically connected to the auxiliary read bit line.

3. The memory device according to claim 1, wherein the dynamic voltage controller comprises a P-type transistor, a source/drain of the P-type transistor is electrically connected to the second voltage, the other source/drain of the P-type transistor is electrically connected to the auxiliary read bit line, and the gate of the P-type transistor is electrically connected to the output of the selecting circuit.

4. The memory device according to claim 1, wherein each of the first voltage and the second voltage is larger than the reference voltage.

5. The memory device according to claim 4, wherein the first voltage and the second voltage have the same voltage level.

6. A voltage interpreting method for read bit line, the voltage interpreting method being applied to a memory device, the memory device comprising a memory cell array, a first pre-charging switch circuit, a selecting circuit and a sense amplifier, the memory cell array comprising a plurality of read word lines, a plurality of read bit lines and a plurality of first memory cells, the first memory cells being arranged in a matrix, and each of the first memory cells being electrically connected to one of the read bit lines and one of the read word lines, the first pre-charging switch circuit being electrically connected to each of the first memory cells, the first pre-charging switch circuit being used for receiving a first voltage and for determining whether or not to supply the first voltage to each of the first memory cells as an operating voltage according to a pre-charging control signal, the selecting circuit being electrically connected to each of the read bit lines, the selecting circuit being used for selecting one of the read bit lines and referring the signal on the selected read bit line as an output signal, the sense amplifier being electrically connected to the output of the selecting circuit, the voltage interpreting method comprising:
   providing an auxiliary memory cell array, wherein the auxiliary memory cell array comprises an auxiliary read bit line and a plurality of second memory cells, the second memory cells are arranged in a matrix, and each of the second memory cells is electrically connected to the auxiliary read bit line and one of the read word lines;
   providing a second pre-charging switch circuit, wherein the second pre-charging switch circuit is electrically connected to each of the second memory cells, the second pre-charging switch circuit is used for receiving a reference voltage and for determining whether or not to supply the reference voltage to each of the second memory cells as an operating voltage according to the pre-charging control signal;
   determining whether or not to supply the second voltage to the auxiliary read bit line according to the voltage level of the output signal of the selecting circuit, so as to dynamically adjust the voltage level of the voltage on the auxiliary read bit line; and
   supplying the voltage on the auxiliary read bit line to the sensing amplifier, wherein the sensing amplifier compares the voltage level of the output signal of the selecting circuit with the voltage level of the voltage on the auxiliary read bit line, so as to output a sensing result accordingly.

7. The voltage interpreting method according to claim 6, wherein the first memory cells and the second memory cells have the same circuit structure, each of the first memory cells and the second memory cells has only one data read port, the data read port of each of the first memory cells is electrically connected to one of the read bit lines, and the data read port of each of the second memory cells is electrically connected to the auxiliary read bit line.

8. The voltage interpreting method according to claim 6, wherein the dynamic voltage controller comprises a P-type transistor, a source/drain of the P-type transistor is electrically connected to the second voltage, the other source/drain of the P-type transistor is electrically connected to the auxiliary read bit line, and the gate of the P-type transistor is electrically connected to the output of the selecting circuit.

9. The voltage interpreting method according to claim 6, wherein each of the first voltage and the second voltage is larger than the reference voltage.

10. The voltage interpreting method according to claim 9, wherein the first voltage and the second voltages have the same voltage level.

\* \* \* \* \*